United States Patent
Tsai et al.

(10) Patent No.: US 6,541,347 B2
(45) Date of Patent: Apr. 1, 2003

(54) METHOD OF PROVIDING PLANARITY OF A PHOTORESIST

(75) Inventors: Tzu Ching Tsai, Taichung Hsien (TW); Han Chih Lin, Changhua Hsien (TW); Hui Min Mao, Tainan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 104 days.

(21) Appl. No.: 09/740,827

(22) Filed: Dec. 21, 2000

(65) Prior Publication Data

US 2002/0048895 A1 Apr. 25, 2002

(30) Foreign Application Priority Data

May 31, 2000 (TW) .................................. 89110552 A

(51) Int. Cl.$^7$ ............................................. H01L 21/20
(52) U.S. Cl. ...................... 438/392; 438/386; 438/389; 438/561
(58) Field of Search ............................. 438/392, 393, 438/391, 386, 389, 524, 381, 561

(56) References Cited

U.S. PATENT DOCUMENTS

| | | | | |
|---|---|---|---|---|
| 4,529,621 | A | * | 7/1985 | Ballard ........................... 438/3 |
| 4,994,409 | A | * | 2/1991 | Yoon et al. .................. 438/392 |
| 5,817,550 | A | * | 10/1998 | Carey et al. ................. 438/166 |
| 6,096,598 | A | * | 8/2000 | Furukawa et al. ........... 438/249 |
| 6,146,938 | A | * | 11/2000 | Saida et al. .................. 438/239 |
| 6,165,375 | A | * | 12/2000 | Yang et al. .................. 438/710 |
| 6,245,612 | B1 | * | 6/2001 | Chang et al. ................ 438/249 |
| 6,281,068 | B1 | * | 8/2001 | Cronel et al. ............... 438/243 |
| 6,315,384 | B1 | * | 11/2001 | Ramaswami et al. ......... 347/20 |

* cited by examiner

Primary Examiner—Michael Trinh
(74) Attorney, Agent, or Firm—Birch, Stewart Kolasch & Birch, LLP

(57) ABSTRACT

A method of improving planarity of a photoresist. Before coating the photoresist over a silicon oxide layer, modifying a surface of the silicon oxide layer to enhance an adhesion between the silicon oxide layer and the photoresist. The photoresist flows into trenches of the silicon oxide layer, then the photoresist has good planarity, even after performing a baking process.

8 Claims, 8 Drawing Sheets

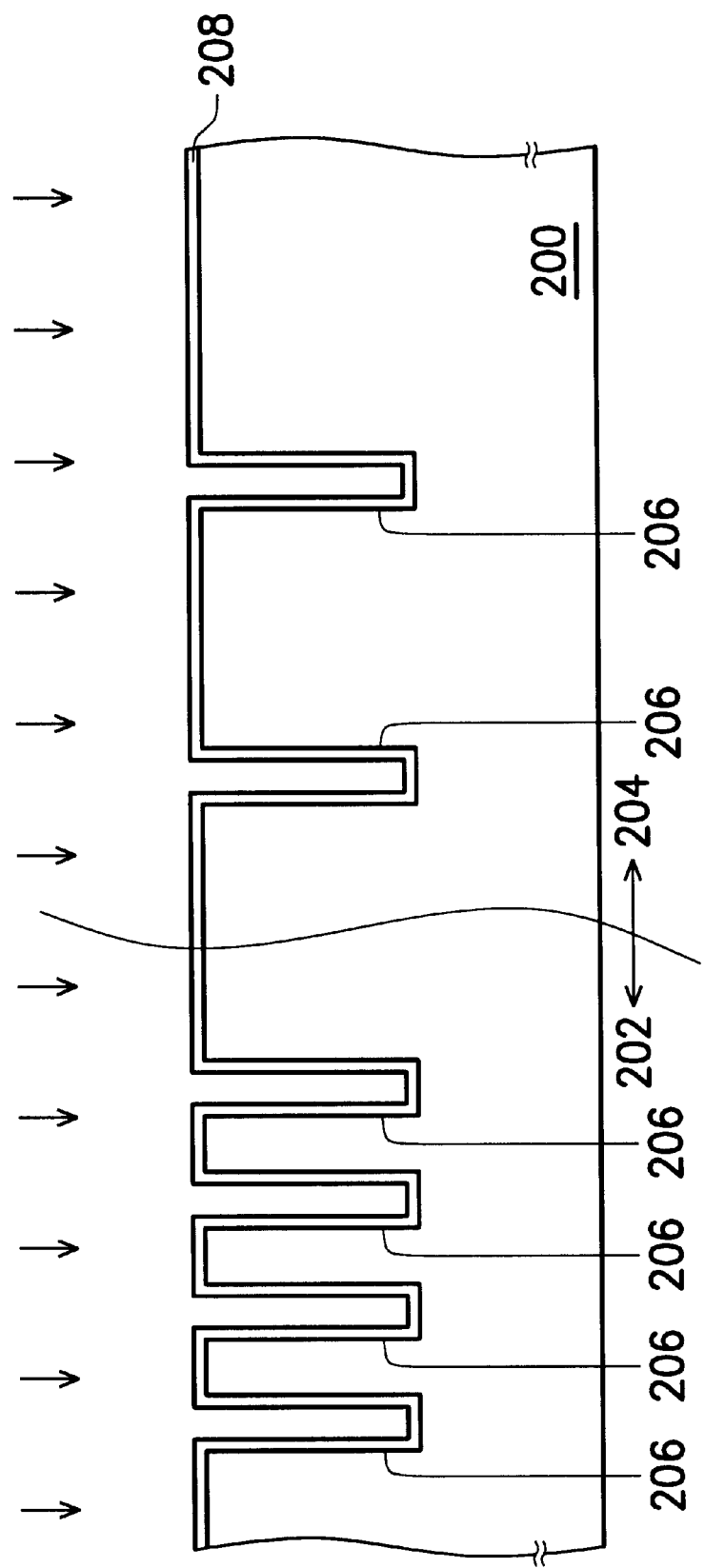

METHOD OF PROVIDING PLANARITY OF A PHOTORESIST

BACKGROUND OF THE INVENTION

1. Field of the Invention

The present invention relates to a method of improving planarity of a photoresist. More particularly, the present invention relates to forming a lower electrode of a trench capacitor by executing the method of improving planarity of the photoresist, therefore, the process yield of the forming of the trench capacitor is easily controlled.

2. Description of the Prior Art

DRAM is memory capable of reading and writing information. Each DRAM cell needs only one transistor and one capacitor, therefore, it is easy to reach higher integration to make it broadly applicable to computers and electric equipment. A trench capacitor is one of the most used capacitors, which is formed in the semiconductor silicon substrate. With the enhancement of the depth of the trench capacitor in the semiconductor silicon substrate, the surface area of the trench capacitor is increased, so that the capacitance is increased. The chip with trench capacitors can be separated into a memory cell array area used to store data and a decoupling capacitor area used to filter noise.

The traditional fabricating method of the trench capacitors is described below. Many trenches are formed in a semiconductor silicon substrate. An As-doped silicon oxide layer is covered over with the semiconductor silicon substrate with trenches. The silicon oxide layer is patterned with lower electrode patterns by coating and baking a photoresist. The photoresist can flow into the trenches in the baking step. Then the hardened photoresist, after baking, is removed by dry etching until the upper surface of the photoresist is lower than that of the semiconductor silicon substrate by a predetermined distance. The exposed silicon oxide layer is removed by using the photoresist as a mask. Then, the doped ions, As, in the silicon oxide layer is drived into the semiconductor silicon substrate to form a conducing layer as a lower electrode of the trench capacitor.

The capacitance of the trench capacitor is related to the surface area of the lower electrode, which is determined by the area of the silicon oxide layer covering the trench. The area of the silicon oxide layer covering the trench is controlled by the distance between the upper surface of the photoresist and that of the semiconductor silicon substrate. However, the distance is hardly controlled. Because the adhesion between the photoresist and the silicon oxide layer is too weak to make the photoresist flow into the trench after spin coating. During the baking of the photoresist, the photoresist can flow into the trenches. Nevertheless, the densities of the trenches in the memory cell array area and in the decoupling capacitor area are different. A mass of the photoresist flows into the trenches in the higher density area (the memory cell array area) so that the surface of the hardened photoresist is lower. A small quantity of the photoresist flows into the trenches in the lower density area (the decoupling capacitor area) so that the surface of the hardened resist is higher. Therefore, there is a height difference existing in the surface of the hardened resist in different areas.

Moreover, the difference of the distances between the upper surface of the photoresist and that of the semiconductor silicon substrate in different trenches exists after wet etching the photoresist. For example, under the design rule of 0.175 $\mu$m, the above-mentioned difference reaches 1.2 $\mu$m. If in order to prevent the lower electrode in the lower density area (the decoupling capacitor area) and the buried strap (or called ion doped band) subsequently formed in the top of the semiconductor silicon substrate from short, the lower electrode formed in the memory cell array area has a smaller surface area, which will damage the storage performance. If in order to enhance the surface area of the lower electrode in the memory cell array area, the breakdown voltage between the lower electrode in the decoupling capacitor area and the buried strap will be reduced, and may even short the circuit. Therefore, there is difficulty in etching the photoresist. It is also possible that whole process fails.

SUMMARY OF THE INVENTION

Therefore, the present invention provides a method of improving planarity of a photoresist.

Furthermore, the present invention provides a method to effectively control the distance between the upper surface of the substrate and the upper surface of the photoresist under different kinds of densities that exist in trenches.

Moreover, the present invention provides a manufacturing method of trench capacitors, so as to prevent the capacitors in the decoupling capacitor area from invalidation, and prevent the capacitances in the memory cell array area from reducing.

Also, the present invention provides a manufacturing method for trench capacitors, which can increase the breakdown voltage between the lower electrode and the ion doped band to enhance the reliability of the capacitors.

The present invention provides a method of improving planarity of a photoresist, comprising: providing a silicon oxide layer having a plurality of trenches therein; modifying a surface of the silicon oxide layer to enhance an adhesion between the silicon oxide layer and a photoresist; coating the photoresist over the silicon oxide layer, wherein the photoresist flows into the trenches of the silicon oxide layer; and performing a baking process.

The present invention provides a manufacturing method of a lower electrode of a trench transistor, comprising: providing a substrate having a plurality of trenches therein; forming a conformal silicon oxide layer over the substrate, wherein the silicon oxide layer is doped with a conducting dopant; modifying a surface of the silicon oxide layer to enhance the adhesion between the silicon oxide layer and a photoresist; coating the photoresist over the substrate, wherein the photoresist flows into the trenches of the substrate; removing a part of the photoresist till a distance exists between the upper surface of the photoresist and the upper surface of the substrate; removing the exposed silicon oxide layer; removing the photoresist; and driving the conducting dopant into the substrate to form a lower electrode.

In accordance with the present invention, the method of modifying the surface of the silicon oxide layer comprises performing an oxygen plasma treatment, or performing a wet treatment with a mixed solution of $H_2SO_4$ and $H_2O_2$, or performing a wet treatment with a mixed solution of $NH_4OH$ and $H_2O_2$.

BRIEF DESCRIPTION OF THE DRAWINGS

The present invention will become more fully understood from the detailed description given herein below and the accompanying drawings, given by way of illustration only and thus not intended to be limitative of the present invention.

FIGS. 2A to 2F show sectional-views of manufacture of the trench capacitor according to the second embodiment of the present invention.

DETAILED DESCRIPTION OF THE INVENTION

After coating the photoresist, it does not flow into the holes or trenches of the silicon oxide layer, but during performing a baking process. Hence, the density of the holes or trenches affects planarity of the baked photoresist. If the photoresist can flow into the holes or trenches of the silicon oxide layer during the coating of the photoresist, then planarity of the photoresist will not change after the baking process is performed. In the present invention, the silicon oxide layer is modified before coating the photoresist, then it flows into the holes or trenches of the silicon oxide layer during coating the photoresist thereon, so as to improve planarity of the baked photoresist.

Embodiment 1

Figure 1A:
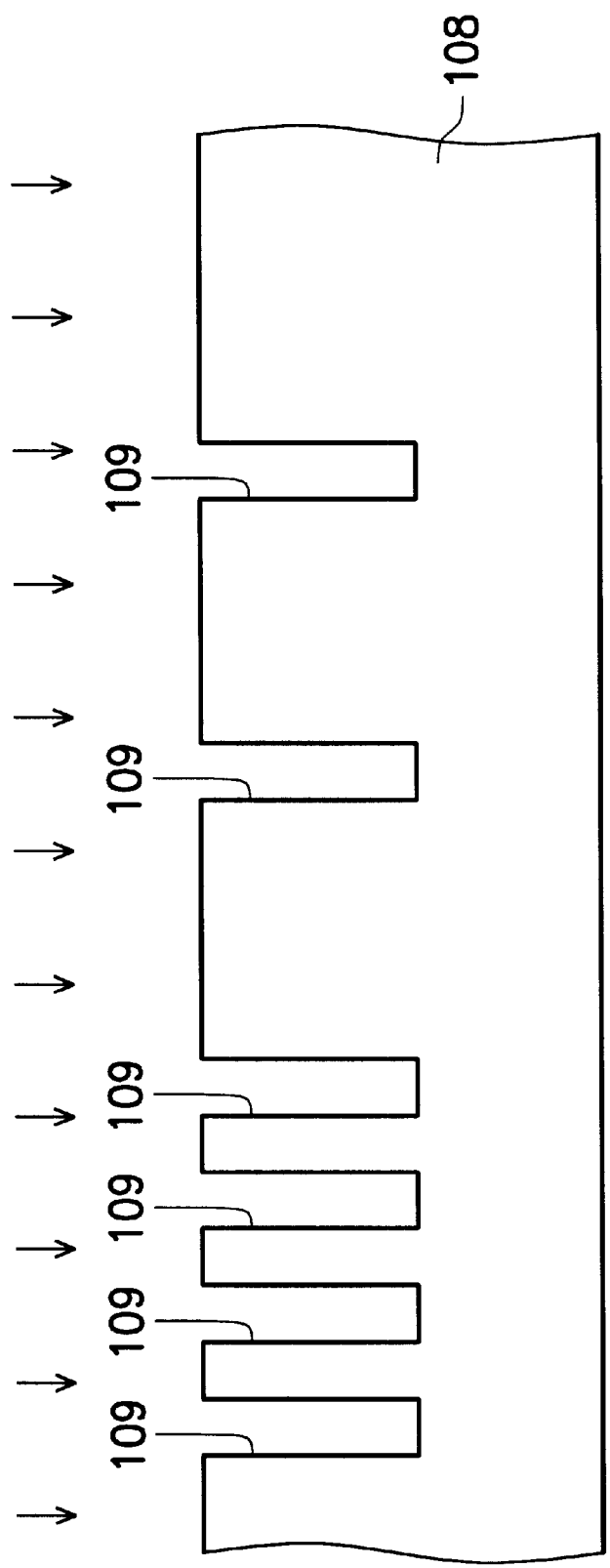
FIGS. 1A to 1B show sectional-views of the method of improving planarity of the photoresist according to the first embodiment of the present invention.
Figure 1B:
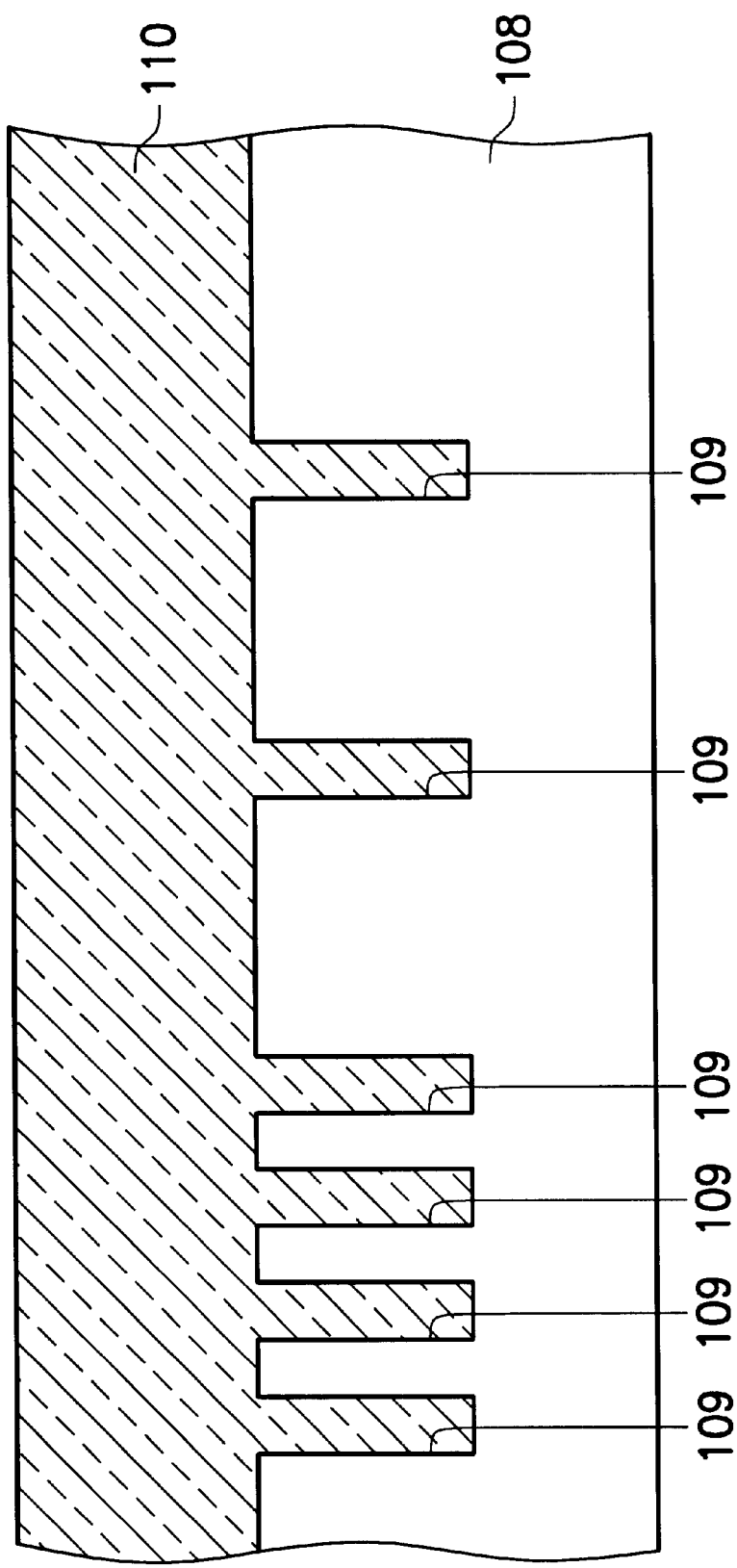

FIGS. 1A to 1B illustrate the cross-sectional views of improving planarity of a photoresist.

Referring to FIG. 1A, the present invention is focused on modifying; a silicon oxide layer 108 with plenty of trenches (or holes) 109. Then, the silicon oxide layer 108 can have a good adhesive with a following coated photoresist, so that the photoresist has good mobility on the modified silicon oxide layer 108. Therefore, the photoresist can flow into the trenches (or holes) 109 during coating, as shown in FIG. 1B.

The above-mentioned silicon oxide layer 108 is As-doped silicon glass or silicon oxide with other dopants. The method of modifying the surface of the silicon oxide layer 108 is by treating it with an oxygen plasma, or performing a wet treatment with a mixed solution of sulfuric acid ($H_2SO_4$) and hydrogen peroxide ($H_2O_2$), or performing a wet treatment with a mixed solution of ammonia ($NH_4OH$) and hydrogen peroxide ($H_2O_2$). The surface of the modified silicon oxide layer 108 has a lot of —Si—O—H, therefore, the adhesion between the modified silicon oxide layer 108 and the photoresist 110 is enhanced.

Then, a baking process is performed. If the photoresist 110 should be used as a mask by performing an exposure and a developing processes, then before performing the exposure and developing processes, a soft bake step is performed to drive out the solvent inside the photoresist. After performing the exposure and developing processes, a hard bake step is performed to harden the photoresist 110. The hardened photoresist 110 has good planarity.

Embodiment 2

FIGS. 2A through FIG. 2F show flowing sectional-views of manufacturing a lower electrode of a trench capacitor with applying the method of improving planarity of a photoresist.

Referring to FIG. 2A, a substrate 200, such as semiconductor silicon substrate, is provided. The substrate 200 comprises a memory cell array area 202 and a decoupling capacitor area 204. Trenches 206 are formed in the substrate 200, wherein the density of the trenches 206 located in the memory cell array area 202 is higher, and that of the trenches 206 located in the decoupling capacitor area 204 is lower.

A conformal silicon oxide layer 208 with doping a conductive dopant, such as P, As or the like, is formed over the substrate 200. The surface of the conformal silicon oxide layer 208 is modified to enhance the adhesion with photoresist, so as to increase the mobility of the photoresist coated thereon. The method of modifying the surface of the conformal silicon oxide layer 208 is by treating it with an oxygen plasma, or performing a wet treatment with a mixed solution of sulfuric acid ($H_2SO_4$) and hydrogen peroxide ($H_2O_2$), or performing a wet treatment with a mixed solution of ammonia ($NH_4OH$) and hydrogen peroxide ($H_2O_2$). The surface of the modified conformal silicon oxide layer 208 has a lot of —Si—O—H, therefore, its adhesion with the photoresist is enhanced.

Figure 2B:
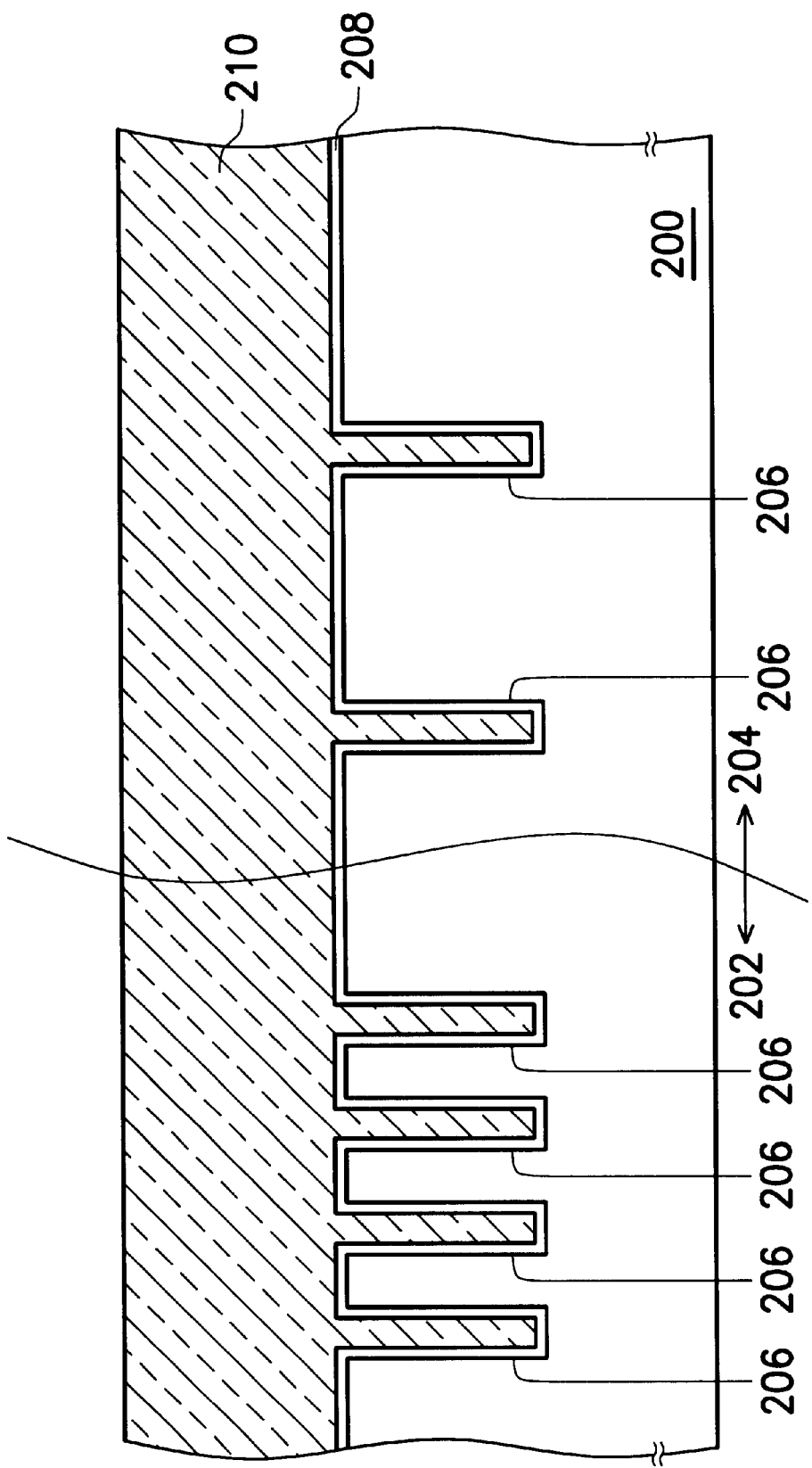
Figure 2C:
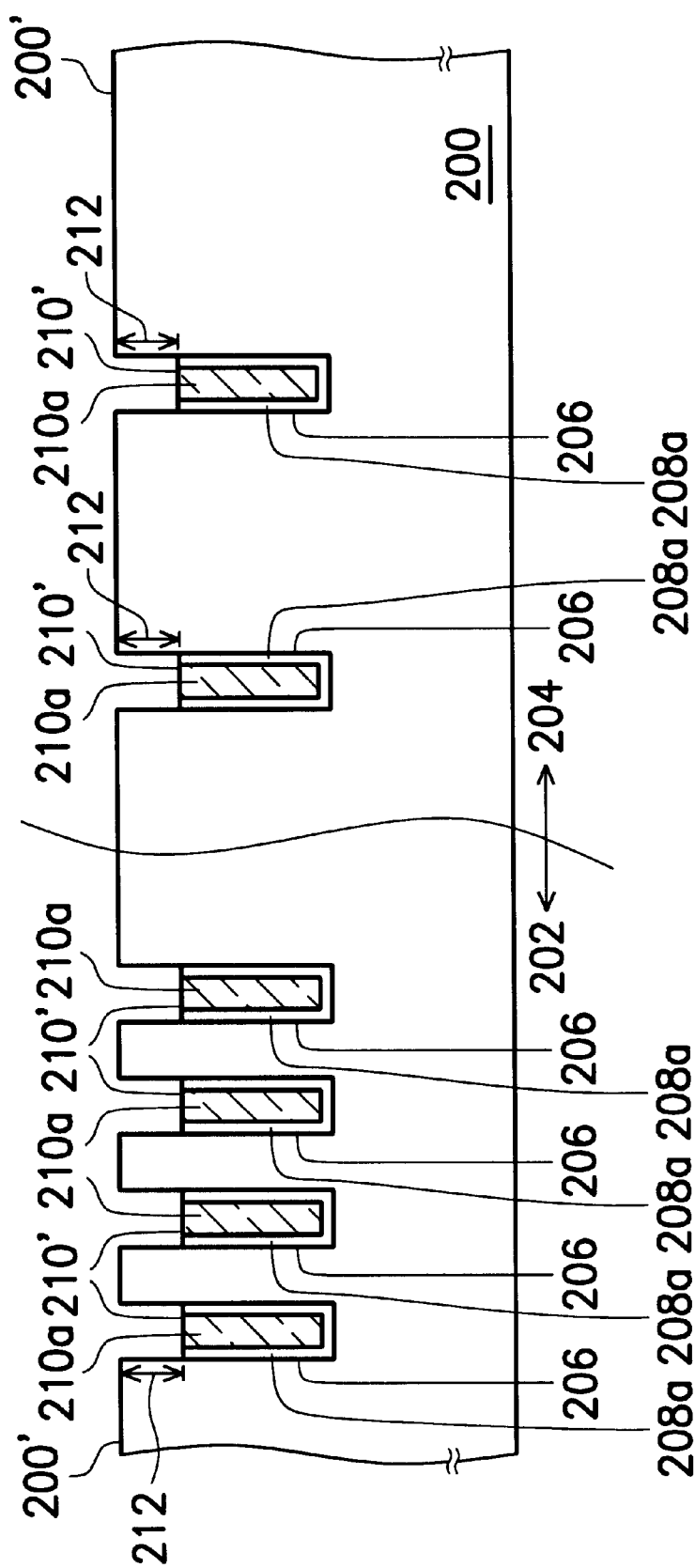
Figure 2D:
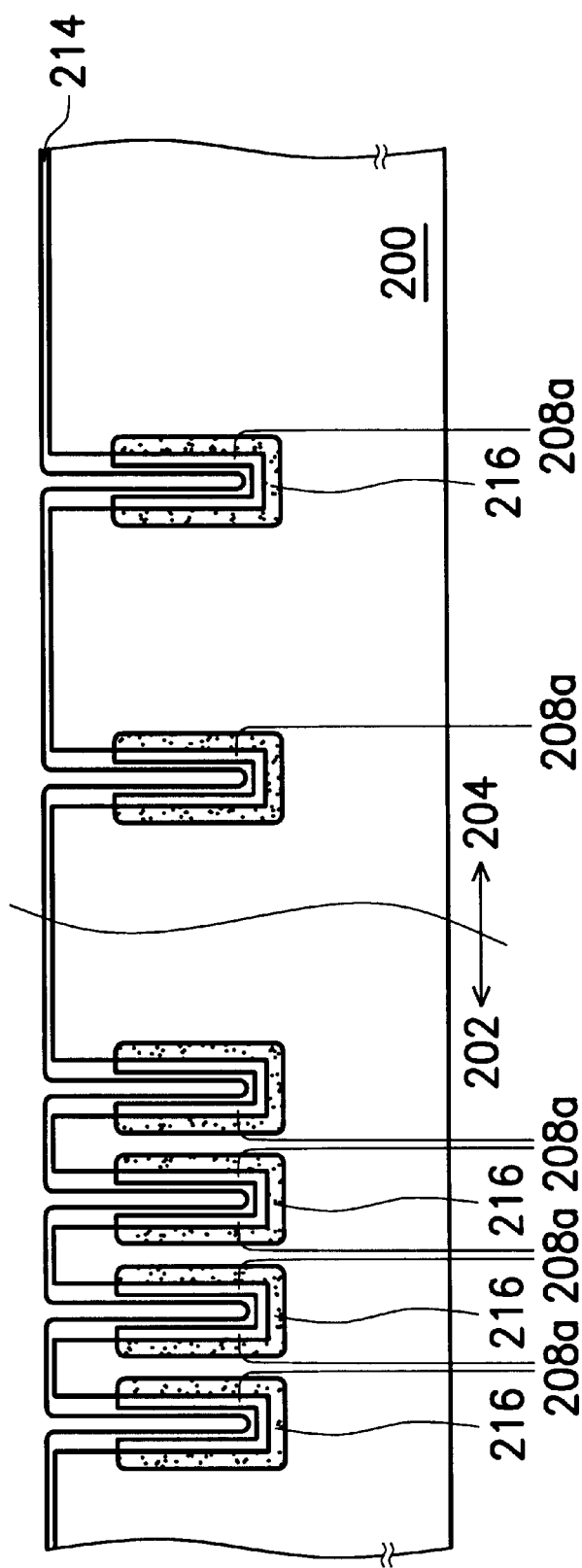

Referring to FIG. 2B, a photoresist layer is coated over the conformal silicon oxide layer 208 by, for example, spin coating. Because of the good adhesion between the modified conformal silicon oxide layer 208 and the photoresist layer 210, the photoresist layer 210 can flow into the trenches 206 during the coating step. Therefore, the photoresist layer 210 has good planarity.

Referring to 2C, a baking process is performed to make the photoresist layer 210 harden, and then is transferred to a hardened photoresist layer 210a. A part of the photoresist layer 210a is removed by etching, such as wet etching or dry etching, with the preferred being dry etching, so as to make the upper surface 210' of the photoresist layer 210a lower than the upper surface 200' of the substrate 200 with a distance 212, such as 1~2 μm. The exposed silicon oxide layer 208 is removed by wet etching with using the photoresist layer 210a as a mask.

Referring to 2D, after removing the photoresist layer 210a, a conformal or blanket dielectric layer 214 is formed over the whole substrate 200. The dielectric layer 214 is formed by CVD with a process gas, such as TEOS. Then, a thermal process is performed to drive the conductive dopant in the silicon oxide layer 208a into the substrate 200, so as to form buried plates (BP) inside the substrate 200 surrounding the trenches 206. Each of the buried plates is a lower electrode 216 of a capacitor. The dielectric layer 214 is used to prevent the conductive dopant in the silicon oxide layer 208a from diffusion to the chamber during the thermal process.

Figure 2E:
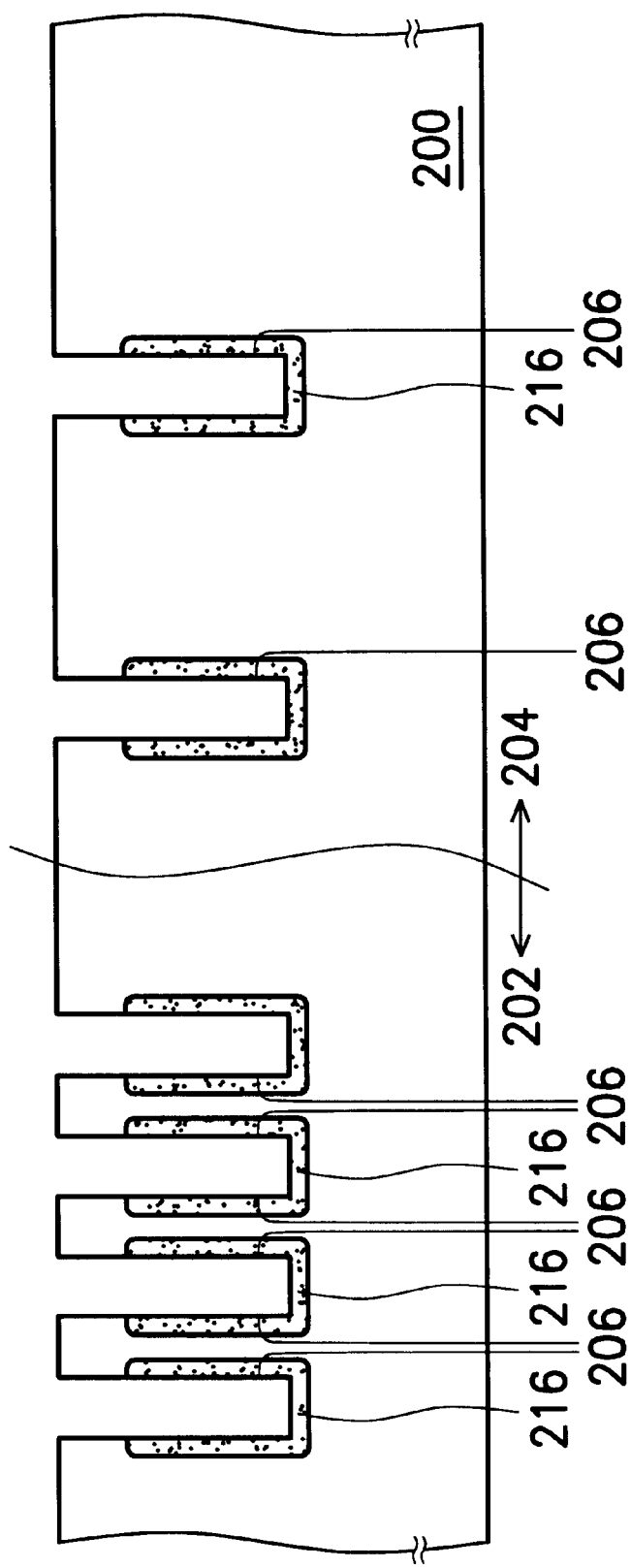
Figure 2F:
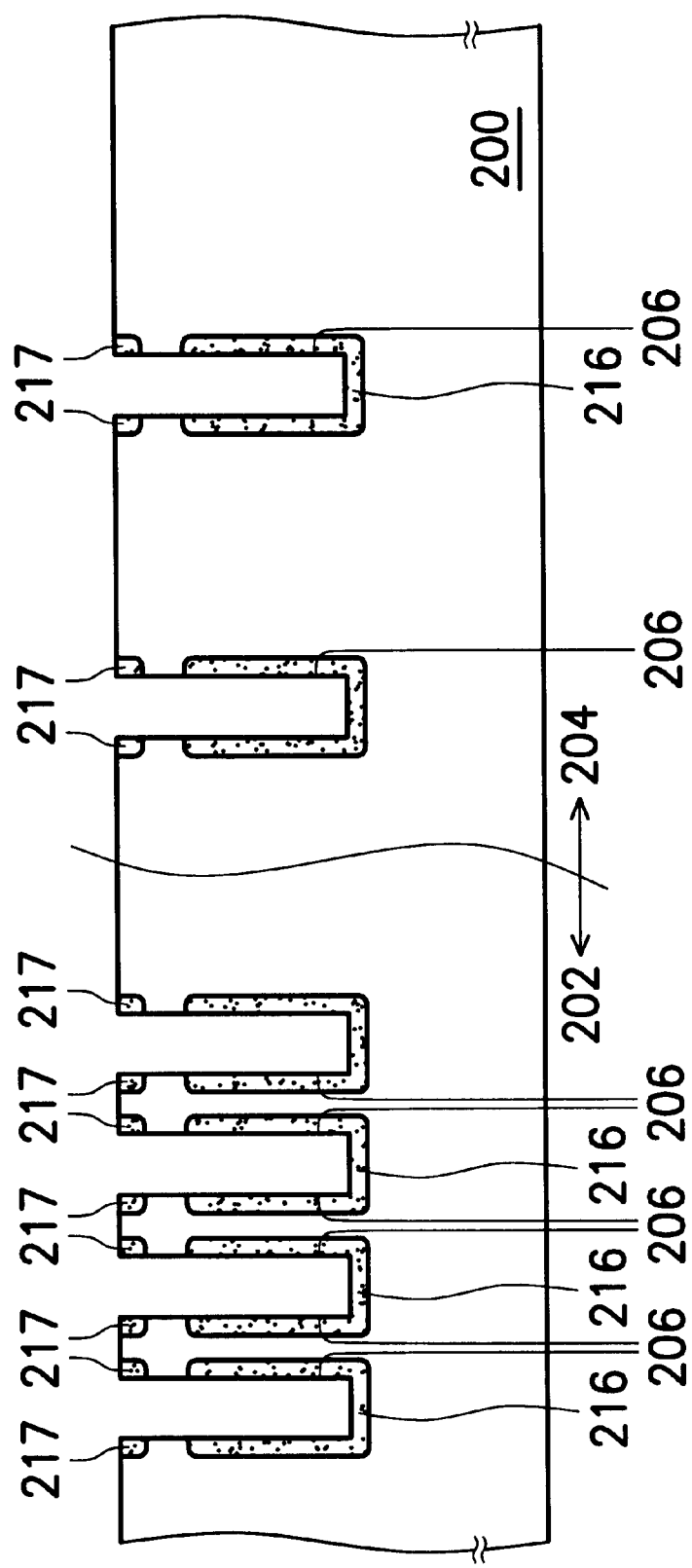

Referring to FIG. 2F, ion doped bands, that is, buried straps (BSs) 217 which connect to sources/drains are formed in the top of the trenches 206.

Referring to FIG. 2E, after forming the lower electrode 216, the dielectric layer 214 and the silicon oxide layer 208a are removed. The following processes are continued but are not related to the present invention. Therefore, only a simple description of formation of sources and drains is given below.

According to the above-mentioned description, the present invention has the following advantages.

a. The method of improving planarity of the photoresist can apply to coat the photoresist over any kind of silicon oxide layer.

b. In the manufacture of the lower electrode of the trench capacitor, with modifying the surface of the doped silicon oxide layer, the distance between the upper surface of the photoresist and the upper surface of the substrate is under control, no matter how different the densities of the trenches are. Therefore, the process yield of the lower electrode of the capacitor can be improved.

c. By improving planarity of the photoresist, the capacitors in the memory cell array area have higher capacitances without influencing the quality of the capacitors in the decoupling capacitor area.

d. The breaking voltage between the buried strap and the buried plate is enhanced, and the reliability of the trench capacitor in also enhanced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A manufacturing method of a lower electrode of a trench capacitor, comprising:

providing a substrate having a plurality of trenches therein;

forming a conformal silicon oxide layer over the substrate, wherein the silicon oxide layer is doped with a conducting dopant;

modifying a surface of the silicon oxide layer to enhance the adhesion between the silicon oxide layer and a photoresist with an oxygen plasma treatment or a wet treatment;

coating the photoresist over the substrate, wherein the photoresist flows into the trenches of the substrate and has planarity;

baking the photoresist to harden the photoresist without loss of planarity;

removing a part of the photoresist until a distance exists between the upper surface of the photoresist and the upper surface of the substrate;

removing the exposed silicon oxide layer;

removing the photoresist; and driving the conducting dopant into the substrate to form a lower electrode.

2. The method as claimed in claim 1, wherein the conducting dopant comprises As.

3. The method as claimed in claim 1, wherein the conducting dopant comprises P.

4. The method as claimed in claim 1, wherein the wet treatment is performed with a mixed solution of $H_2SO_4$ and $H_2O_2$.

5. The method as claimed in claim 1, wherein the wet treatment is performed with a mixed solution of $NH_4OH$ and $H_2O_2$.

6. The method as claimed in claim 1, wherein the method of removing the photoresist comprises wet etching.

7. The method as claimed in claim 1, before driving the conducting dopant into the substrate, further comprising covering a dielectric layer over the silicon oxide layer and the substrate.

8. The method as claimed in claim 1, wherein the distance between the upper surface of the photoresist and the upper surface of the substrate is 1~2 $\mu$m.

* * * * *